(12) United States Patent
Hosomi et al.

(10) Patent No.: US 7,315,053 B2
(45) Date of Patent: *Jan. 1, 2008

(54) MAGNETORESISTIVE EFFECT ELEMENT AND MAGNETIC MEMORY DEVICE

(75) Inventors: Masanori Hosomi, Miyagi (JP);
Tetsuya Mizuguchi, Kanagawa (JP);
Kazuhiro Ohba, Miyagi (JP);
Kazuhiro Bessho, Kanagawa (JP);
Tetsuya Yamamoto, Kanagawa (JP);
Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 50 days.

This patent is subject to a terminal disclaimer.

(21) Appl. No.: 10/480,242

(22) PCT Filed: Apr. 8, 2003

(86) PCT No.: PCT/JP03/04461

§ 371 (c)(1),
(2), (4) Date: Jul. 30, 2004

(87) PCT Pub. No.: WO03/085750

PCT Pub. Date: Oct. 16, 2003

(65) Prior Publication Data

US 2004/0245553 A1     Dec. 9, 2004

(30) Foreign Application Priority Data

Apr. 9, 2002    (JP) .............................. 2002-106926

(51) Int. Cl.
*H01L 29/76*  (2006.01)
(52) U.S. Cl. ............... 257/295; 257/295; 257/E21.665; 257/E29.323

(58) Field of Classification Search ................ 257/295, 257/296; 365/145
See application file for complete search history.

(56) References Cited

U.S. PATENT DOCUMENTS

| 6,104,632 | A | 8/2000 | Nishimura | |
|---|---|---|---|---|
| 6,385,082 | B1 * | 5/2002 | Abraham et al. | ........... 365/171 |
| 6,556,473 | B2 * | 4/2003 | Saito et al. | ................. 365/158 |
| 6,831,314 | B2 * | 12/2004 | Higo et al. | ................. 257/295 |
| 6,879,514 | B2 * | 4/2005 | Hosomi et al. | ............. 365/158 |
| 2002/0034055 | A1 | 3/2002 | Seyama | |
| 2002/0036876 | A1 | 3/2002 | Kawawake | |
| 2002/0058158 | A1 | 5/2002 | Odagawa | |
| 2002/0167766 | A1 | 11/2002 | Hayashi | |

FOREIGN PATENT DOCUMENTS

EP     959475     11/1999

(Continued)

*Primary Examiner*—Andy Huynh
*Assistant Examiner*—Thinh T Nguyen
(74) *Attorney, Agent, or Firm*—Sonnenschein Nath & Rosenthal LLP

(57) ABSTRACT

Write characteristics and read characteristics can be improved at the same time by applying novel materials to ferromagnetic layers. In a magnetoresistive effect element having a pair of ferromagnetic layers being opposed to each other through an intermediate layer to cause a current to flow in the direction perpendicular to the film plane to obtain a magnetoresistive change, at least one of the ferromagnetic layers contains a ferromagnetic material containing Fe, Co and B. The ferromagnetic material should preferably contain $Fe_aCo_bNi_cB_d$ (in the chemical formula, a, b, c and d represent atomic %. $5 \leq a \leq 45$, $35 \leq b \leq 85$, $0 < c \leq 35$, $10 \leq d \leq 30$. a+b+C+d=100).

6 Claims, 4 Drawing Sheets

FOREIGN PATENT DOCUMENTS

| | | |
|---|---|---|
| EP | 1031592 | 12/2000 |
| JP | 2000-76844 | 3/2000 |
| JP | 2000-101164 | 4/2000 |
| JP | 2000-187976 | 7/2000 |
| JP | 2001-237472 | 8/2001 |
| JP | 2002-092829 | 3/2002 |
| JP | 2002-176211 | 6/2002 |
| JP | 2003-060258 | 2/2003 |
| JP | 2003-133614 | 5/2003 |
| KR | 2001-0007428 | 1/2001 |

* cited by examiner

MAGNETORESISTIVE EFFECT ELEMENT AND MAGNETIC MEMORY DEVICE

BACKGROUND OF THE INVENTION

The present invention relates to a magnetoresistive effect element for obtaining a magnetoresistive change by causing a current to flow in the direction perpendicular to the layer plane and a magnetic memory device.

As information communication devices, in particular, personal small devices such as personal digital assistants are making great spread, elements such as memories and logics comprising information communication devices are requested to have higher performance such as higher integration degree, higher operation speed and lower power consumption. In particular, technologies for making nonvolatile memories become higher in density and larger in storage capacity are progressively increasing their importance as technologies for replacing hard disk and optical disc that cannot be essentially miniaturized because they have movable portions.

As nonvolatile memories, there may be enumerated flash memories using semiconductors and FRAM (Ferro electric Random Access Memory) using ferroelectric material and the like. However, the flash memory encounters with a drawback that its write speed is as slow as the microsecond order. On the other hand, it is pointed out that the FRAM has a problem in which it cannot be rewritten so many times.

A magnetic memory device called an MRAM (Magnetic Random Access Memory), which had been written in "Wang et al., IEEE Trans Magn, 33 (1977), 4498" receives a remarkable attention as nonvolatile memory which can overcome these drawbacks. Since this MRAM is simple in structure, it can be easily integrated at a higher integration degree. Moreover, since it is able to memorize information based upon the rotation of magnetic moment, it can be rewritten so many times. It is also expected that the access time of this magnetic random access memory will be very high, and it was already confirmed that it can be operated at the access time of nanosecond order.

A magnetoresistive effect element for use with this MRAM, in particular, a tunnel magnetoresistive (Tunnel Magnetoresistive TMR) element is fundamentally composed of a ferromagnetic tunnel junction of ferromagnetic layer/tunnel barrier layer/ferromagnetic layer. This element generates magnetoresistive effect in response to a relative angle between the magnetizations of the two magnetic layers when an external magnetic field is applied to the ferromagnetic layers under the condition in which a constant current is flowing through the ferromagnetic layers. When the magnetization directions of the two magnetic layers are anti-parallel to each other, a resistance value becomes maximum. When they are parallel to each other, a resistance value becomes minimum. Function of memory element can be demonstrated by creating the anti-parallel state and the parallel state with application of the external magnetic field.

In particular, in the spin-valve type TMR element, when one ferromagnetic layer is antiferromagnetically coupled to the adjacent antiferromagnetic layer and thereby the magnetization direction is always made constant, thereby resulting in the same being placed in the state of a magnetization fixed layer. The other ferromagnetic layer is formed as an information recording layer of which the magnetization direction can be easily inverted with application of external magnetic field and the like.

This resistance changing ratio is expressed by the following equation (1) where P1, P2 represent spin polarizabilities of the two magnetic layers.

$$2P1P2/(1-P1P2) \tag{1}$$

As described above, the resistance changing ratio increases as the respective spin polarizabilities increase. With respect to a relationship between materials for use with ferromagnetic layers and this resistance changing ratio, ferromagnetic chemical elements of Fe group such as Fe, Co, Ni and alloys of three kinds thereof have been reported so far.

The MRAM is fundamentally composed of a plurality of bit write lines, a plurality of word lines intersecting these bit write lines and TMR elements provided at crossing points between these bit write lines and word write lines as magnetic memory elements as has been disclosed in Japanese laid-open patent application No. 10-116490. Then, when information is written in such MRAM, information is selectively written in the TMR element by utilizing an asteroid characteristic.

The bit write line and the word write line for use with the MRAM are made of conductive thin films such as Cu and Al which are interconnection materials of ordinary semiconductor devices. When information is written in a magnetic memory element of which the inverted magnetic field, for example, is 200 Oe by the bit write line and the word write line made of such ordinary interconnection materials, the bit write line and the word write line being 0.25 μm in width, a current of approximately 2 mA is required. When the bit write line and the word write line have a thickness of 0.25 μm that is the same as the line width thereof, a current density obtained at that time is $3.2 \times 10^6$ A/cm$^3$ that is close to approximately a limit value of breaking of wire by electromigration. Accordingly, reduction of the write current is indispensable for maintaining reliability of interconnection. Moreover, in view of a problem of heat generated by the write current and from a standpoint of decreasing power consumption, this write current has to be decreased.

As a method of realizing the reduction of the write current in the MRAM, there is enumerated a method of decreasing a coercive force of the TMR element. The coercive force of the TMR element is properly determined based upon suitable factors such as the size, shape, layer arrangement of the TMR element and selection of materials. However, when the TMR element is microminiaturized for the purpose of increasing a recording density of the MRAM, for example, a disadvantage occurs, in which the coercive force of the TMR element increases. Accordingly, in order to microminiaturize (to increase integration degree) of the MRAM and to decrease the write current at the same time, the decrease of the coercive force of the TMR element should be attained from the materials standpoint.

If the magnetic characteristic of the TMR element is dispersed at every element in the MRAM and the magnetic characteristic is dispersed when the same element is measured repeatedly, then a problem arises, in which the selective writing using the asteroid characteristic becomes difficult. Therefore, the TMR element is requested to have a magnetic characteristic by which an ideal asteroid curve can be drawn. In order to draw the ideal asteroid curve, an R-H (resistance-magnetic field) curve obtained when TMR is measured should not have noise such as a Barkhausen noise, a rectangle property of a wave form should be excellent, the magnetization state should be stable and the dispersion of the coercive force Hc should be small.

Information may be read out from the TMR element as follows. When magnetic moments of one ferromagnetic layer and the other magnetic layer across the tunnel barrier layer are anti-parallel to each other, this state is referred to as a "1", for example. Conversely, when the respective magnetic moments are parallel to each other, this state is referred to as a "0". Information is read out from the element based upon a difference current obtained at a constant bias voltage or a difference voltage obtained at a constant bias current in these states. Accordingly, when scatterings of resistance between the elements are the same, a higher TMR ratio is advantageous and hence a memory that can operate at a high speed, having a high integration degree and having a low error rate can be realized.

Bias voltage dependence of the resistance changing ratio exists in the TMR ratio, and it is known that the TMR ratio decreases as the bias voltage increases. When information is read out from the element based upon the difference current or the difference voltage, since it is customary for the resistance changing ratio to take the maximum value of the read signal at the voltage (Vh) which decreases by half depending upon the bias voltage dependence, small bias voltage dependence is effective for decreasing read errors.

As described above, the TMR element for use with the MRAM should satisfy the above-mentioned write characteristic requirements and the above-mentioned read characteristic requirements at the same time.

However, when the materials of the ferromagnetic layers of the TMR element are selected, if the alloy compositions by which the spin polarizabilities shown by P1 and P2 in the equation (1) are increased are selected from materials made of only ferromagnetic transition metal chemical elements of Co, Fe, Ni, then the coercive force Hc of the TMR element generally tends to increase.

When the information recording layer is made of a $Co_{75}Fe_{25}$ (atomic %) alloy or the like, although a TMR ratio having large spin polarizabilities and which is greater than 40% can be maintained, it is unavoidable that the coercive force Hc also increases.

But instead, when the information recording layer is made of an $Ni_{80}Fe_{20}$ (atomic %) which is what might be called a permalloy that is known as a soft magnetic material, although the coercive force Hc can decrease, the spin polarizabilities are small as compared with the above-mentioned $Co_{75}Fe_{25}$ (atomic %) alloy so that the TMR ratio is lowered up to about 33%.

Moreover, although a $Co_{90}Fe_{10}$ (atomic %) alloy can produce a TMR ratio of approximately 33% and can suppress the coercive force Hc to approximately an intermediate value obtained between the above-mentioned $Co_{75}Fe_{25}$ (atomic %) alloy and the above-mentioned $Ni_{80}Fe_{20}$ (atomic %) alloy, this alloy is inferior in rectangle ratio of the R-H curve and is unable to provide the asteroid characteristic by which information can be rewritten in the element.

SUMMARY OF THE INVENTION

In view of the conventional actual circumstances, with application of novel materials to the ferromagnetic layers, it is an object of the present invention to provide a magnetoresistive effect element and a magnetic memory device in which write characteristics and read characteristics can be improved at the same time.

In order to attain the above-mentioned object, in a magnetoresistive effect element having a pair of ferromagnetic layers being opposed to each other through an intermediate layer to cause a current to flow in the direction perpendicular to the film plane to obtain a magnetoresistive change, according to the present invention, there is provided a magnetoresistive effect element in which at least one of the ferromagnetic layers contains a ferromagnetic layer such as Fe, Co and B.

A magnetic memory device according to the present invention comprises a magnetoresistive effect element having a pair of ferromagnetic layers being opposed to each other through an intermediate layer to cause a current to flow in the direction perpendicular to the film plane to obtain a magnetoresistive change and word lines and bit lines having the magnetoresistive effect element being sandwiched in the thickness direction, in which at least one of the ferromagnetic layers contains a ferromagnetic material containing Fe, Co and B.

Since at least one of the ferromagnetic layers contains B in addition to Fe and Co that are ferromagnetic transition metal elements as a ferromagnetic material, a magnetoresistive (MR) ratio of a magnetoresistive effect element can be increased, a rectangle property of an R-H curve can be improved, a bias voltage dependence of an MR ratio can be improved, and dispersions of a coercive force can be improved.

DETAILED DESCRIPTION OF THE PRESENTLY PREFERRED EMBODIMENTS

Figure 1:
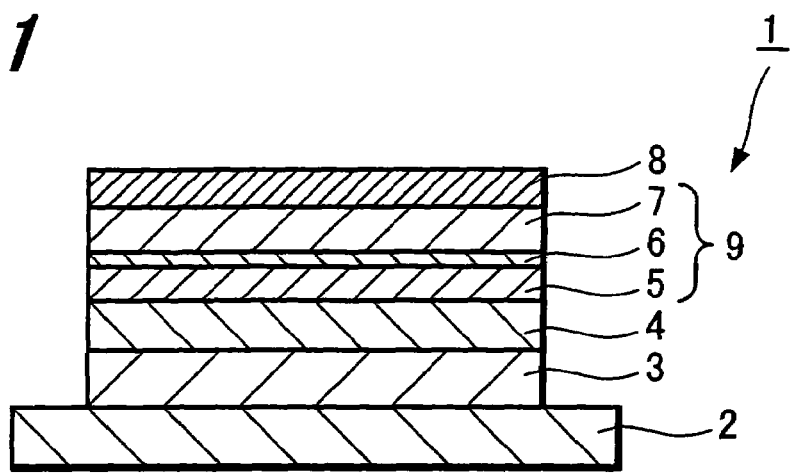
FIG. 1 is a schematic cross-sectional view of a main portion and illustrates an example of a TMR element to which the present invention is applied.

A magnetoresistive effect element and a magnetic memory device to which the present invention is applied will be described below in detail with reference to the drawings.

A tunnel magnetoresistive effect element (herein after referred to as a "TMR element") 1 to which the present invention is applied includes a substrate 2 made of a suitable material such as Si on which an underlayer 3, an antiferromagnetic layer 4, a magnetization fixed layer 5 which is a ferromagnetic layer, a tunnel barrier layer 6, an information recording layer 7 which is a ferromagnetic layer and a top-coat layer 8 are laminated, in that order as shown in FIG.

1, for example. This TMR element 1 sandwiches the tunnel barrier layer 6 by the magnetization fixed layer 5 and the information recording layer 7 of a pair of ferromagnetic layers to form a ferromagnetic tunnel junction 9. The TMR element 1 is of a so-called spin-valve type TMR element comprising two ferromagnetic layers one of which is the magnetization fixed layer 5, the other being the information recording layer 7.

The antiferromagnetic layer 4 is coupled antiferromagnetically to the magnetization fixed layer 5 of one ferromagnetic layer to inhibit the magnetization direction of the fixed magnetization layer 5 from being inverted so that the magnetization direction of the magnetization fixed layer 5 may become always constant. Specifically, in the TMR element 1 shown in FIG. 1, the magnetization direction of only the information recording layer 7 which is the other ferromagnetic layer is inverted with application of external magnetic fields and the like. As the materials comprising the antiferromagnetic layer 4, there can be used an MN alloy containing Fe, Ni, Pt, Ir, Rh and the like, Co oxide, Ni oxide, etc.

In the spin-valve type TMR element 1 shown in the figure, the magnetization fixed layer 5 is antiferromagnetically coupled to the antiferromagnetic layer 4 and thereby the magnetization direction thereof can be made constant. Therefore, the magnetization direction of the magnetization fixed layer 5 is not inverted even with application of the current magnetic field required when information is written in the magnetoresistive effect element.

The tunnel barrier layer 6 can be obtained by oxidizing or nitriding the metal film that has been deposited by a suitable method such as a sputtering method and a vapor deposition method. Moreover, the tunnel barrier layer 6 can also be obtained by a CVD method using organic metals, ozone, nitrogen, halogen, halogenated gas and the like.

Then, according to the present invention, at least one of the magnetization fixed layer 5 and the information recording layer 7 that are the ferromagnetic layers of the ferromagnetic tunnel junction 9 contains B together with Fe and Co that are ferromagnetic transition metal elements as a ferromagnetic material. Although the conventional TMR element having the ferromagnetic layer composed of only ferromagnetic transition metals cannot avoid a disadvantage in which a coercive force increases in accordance with an increase of a spin polarizability, the element according to the present invention contains such ferromagnetic material, and hence the improvement of the spin polarizability is compatible with the reduction of the coercive force. Thus, it is possible to improve a TMR ratio and to reduce a write current. In addition, according to the present invention, while a high TMR ratio is being made compatible with a low coercive force, a rectangle property of an R-H curve can be prevented from being deteriorated. Moreover, since the element according to the present invention contains B, it becomes possible to improve bias voltage dependence.

Figure 2:
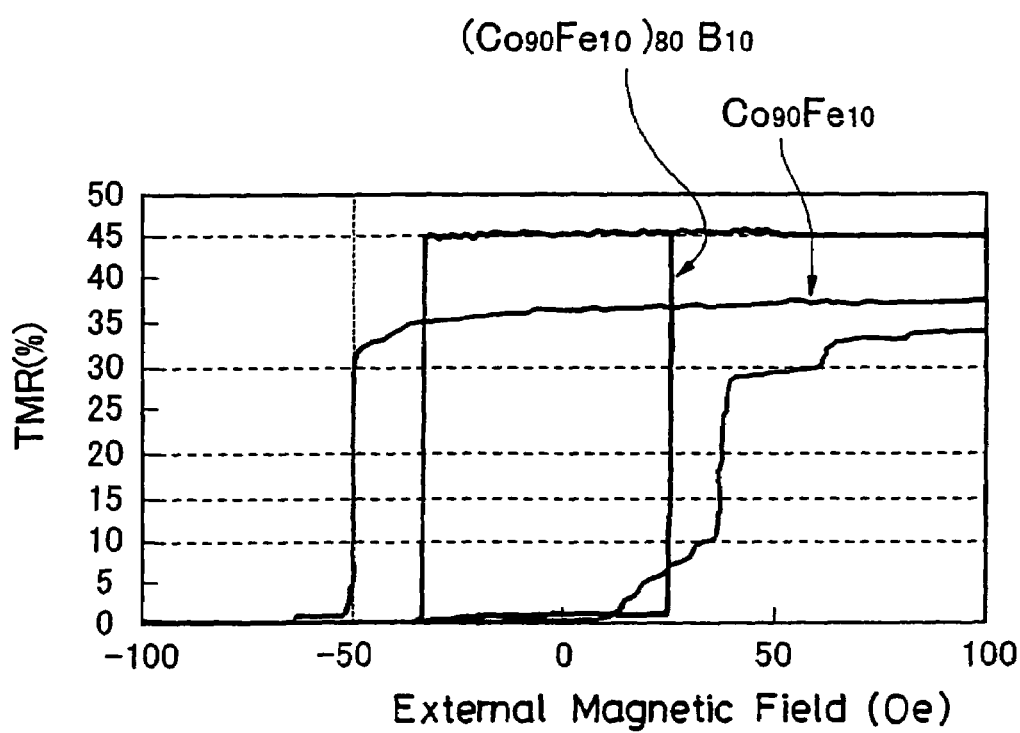
FIG. 2 is a characteristic graph showing resistance-external magnetic field curves of a TMR element having an information recording layer made of a ferromagnetic material containing Fe, Co, B and a TMR element having an information recording layer made of a ferromagnetic material containing Fe, Co.

A TMR element having an information recording layer that contains $(Co_{90}Fe_{10})_{80}B_{10}$ as a ferromagnetic material and a TMR element having an information recording layer that contains $Co_{90}Fe_{10}$, both of which may fall within the range of the present invention have been manufactured, respectively, in actual practice, and the results obtained when resistance-external magnetic field curves of these elements were measured are shown in FIG. 2. As is clear from FIG. 2, the TMR element in which the information recording layer contains Fe, Co, B as the ferromagnetic material was able to reduce the coercive force Hc while holding the TMR ratio at the high level as compared with the TMR element in which the information recording layer contains only Fe and Co as the ferromagnetic material. Moreover, not only a rectangle property of the R-H loop could be improved but also the Barkhausen noise could be decreased. Therefore, according to the present invention, not only the reduction of the write current becomes possible but also the shape of the asteroid curve can be made better and the write characteristic can be improved so that the reduction of write error becomes possible.

Although causes that can achieve such effects are not clear, it may be considered that a microscopic structure in the ferromagnetic layer containing B changes its tissue form from an ordinary metal tissue to microcrystal or amorphous tissue. However, the TMR characteristic cannot always be improved so long as the microscopic structure is in the amorphous state, and it is important that the ferromagnetic layer should contain the above-mentioned chemical elements and that the ferromagnetic layer should satisfy the range of composition which will be described later on.

The alloy composition of Fe, Co, B that the ferromagnetic layer contains has an optimum range, and the ferromagnetic material that at least one of the magnetic layers contains is composed of a composition formula $Fe_xCo_yB_z$ (in the chemical formula, x, y and z represent atomic %) except for unavoidable impurity chemical elements, wherein $5 \leq x \leq 45$, $35 \leq y \leq 85$ and $10 \leq z \leq 30$ should preferably be satisfied. At that time, $x+y+z=100$ is satisfied. These normal will be described below.

First, B that is added to the ferromagnetic layer will be described. If the added amount of B is less than 10 atomic %, a magnetic characteristic of Fe—Co alloy that serves as a base is considerably reflected and only a gentle improvement effect may be achieved. Accordingly, when the ferromagnetic layer contains B of greater than 10 atomic %, a TMR ratio can increase considerably and a rectangle ratio of an R-H curve can be improved as compared with an alloy containing Fe, Co and the like at the same ratio. Since bias dependence of the TMR ratio also is improved and the magnetization state of the information recording layer is further stabilized, a fluctuation of a coercive force is small and a noise on the R-H curve can be decreased considerably. The added amount of B should preferably be under 30 atomic %. If the added amount of B exceeds 30 atomic %, then ferromagnetic characteristics of the information recording layer and the fixed magnetic field of the magnetization fixed layer begin to be degraded. As a consequence, there are risks that the TMR ratio will be lowered, the rectangle ratio of the R-H curve will be deteriorated and that the coercive force will decrease. Therefore, in order to achieve the effects of the present invention by the addition of B, at least one of the ferromagnetic layers should preferably contain B which falls within a range of from 10 atomic % to 30 atomic %.

Next, the (Fe, Co) alloy that serves as the base will be described. From a standpoint of achieving remarkable effects of the present invention, Co is the chemical element indispensable for achieving such effects. To be more specific, the alloy composition containing B needs Co of at least 35 atomic %. This content is selected in order to promote the effects achieved by the addition of B and also to hold the ferromagnetic properties. If Fe is further added to the above-mentioned alloy composition, then similarly to the change observed in the Co—Fe base alloy, the TMR ratio can be improved and the coercive force can be increased. However, if the Fe content exceeds 45 atomic %, then the coercive force increases excessively in the dimension of the element for actual practice, and the resultant product is not suitable for practical use as the TMR element. If the Fe content is less than 5 atomic %, the spin polarizability of the ferromagnetic layer is small, and hence there is a risk that a TMR ratio large enough to enable the element to operate as the magnetoresistive effect element will not be obtained. Therefore, the Fe content should preferably fall within a range of from 5 atomic % to 45 atomic %.

At least one of the ferromagnetic layers of the ferromagnetic tunnel junction of the present invention may contain Ni in addition to Fe, Co, B. Even when the ferromagnetic layer further contains Ni, while the increase of the coercive force is being suppressed, the satisfactory TMR ratio can be maintained, and the improvement effect of the rectangle property of the R-H curve can be obtained. The Ni content also has the optimum range and Ni should preferably fall within a range of from O atomic % to 35 atomic %. The reason for this is that, if the Ni content exceeds 35 atomic %, then the coercive force decreases too much, thereby making it difficult to control an operation of the TMR element. Specifically, the ferromagnetic material that at least one of the ferromagnetic layers contains is composed of a composition formula $Fe_aCo_bNi_cB_d$ (in the chemical formula, a, b, c and d represent atomic %) except unavoidable impurity chemical elements, and $5 \leq a \leq 45$, $35 \leq b \leq 85$, $0 < c \leq 35$, $10 \leq d \leq 30$ should preferably be satisfied. At that time, $a+b+c+d=100$ is satisfied.

While the above-mentioned ferromagnetic material containing Fe, Co, B may be applied to at least one of the information recording layer 7 and the magnetization fixed layer 5, such ferromagnetic material can be applied to at least the information recording layer 7, more preferably, both of the information recording layer 7 and the magnetization fixed layer 5 with more remarkable effects of the present invention being achieved. It is needless to say that other ferromagnetic layers than the ferromagnetic layer including ferromagnetic materials containing Fe, Co, B can use materials that are generally used in this kind of magnetoresistive effect element.

Moreover, when the above-mentioned materials are applied to the information recording layer 7, the film thickness of the information recording layer 7 should preferably fall within a range of from 1 nm to 10 nm. If the above film thickness falls within this range, then satisfactory magnetic characteristics can be maintained. The reason for this is that, if the film thickness of the information recording layer 7 is less than 1 nm, then the magnetic characteristics are degraded considerably and that if on the other hand the film thickness of the information recording layer 7 exceeds 10 nm, then the coercive force of the TMR element increases excessively, making this magnetoresistive effect element become unsuitable for practical use. However, when the information recording layer 7 is not of a single layer composed of a layer made of materials containing the above-mentioned chemical elements but has a laminating layer structure composed of a layer made of materials containing the above-mentioned chemical elements and a suitable layer such as an NiFe layer having a small magnetization amount, for example, it is permitted that the total of the film thickness of the information recording layer 7 may exceed 10 nm.

When the above-mentioned materials are applied to the magnetization fixed layer 5, the film thickness of the magnetization fixed layer 5 should preferably fall within a range of from 0.5 nm to 6 nm. If the film thickness falls within this range, then the effects of the present invention can be achieved more reliably. If the film thickness of the magnetization fixed layer 5 is less than 0.5 nm, the magnetic characteristics are degraded. If on the other hand the film thickness of the magnetization fixed layer exceeds 6 nm, there is a risk that a sufficient exchange coupling magnetic field between it and the antiferromagnetic layer 4 will not be obtained.

Figure 3:
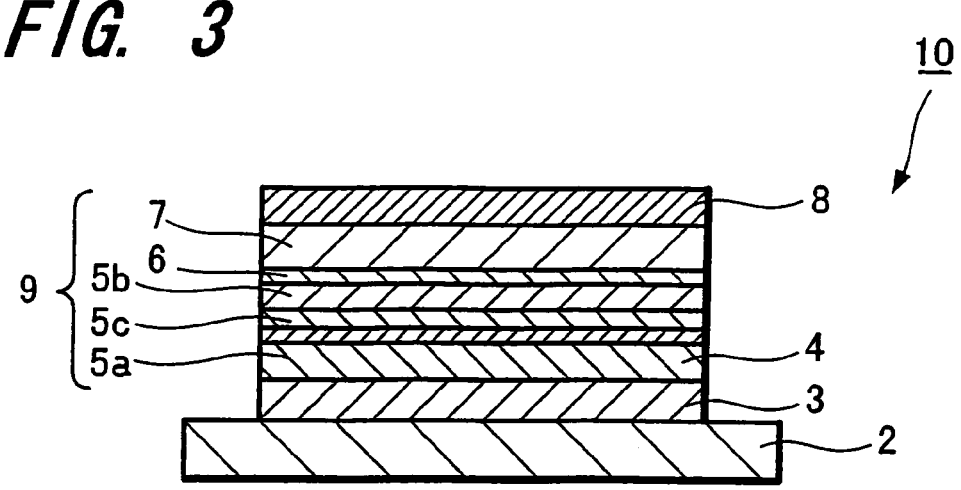
FIG. 3 is a schematic cross-sectional view of a main portion of other example of a TMR element to which the present invention is applied and illustrates a TMR element including a synthetic ferri-structure.

The TMR element of the present invention is not limited to such one in which each of the magnetization fixed layer 5 and the information recording layer 7 is comprised of a single layer as shown in FIG. 1. As shown in FIG. 3, for example, even when the magnetization fixed layer 5 has the synthetic ferri-structure in which the dielectric layer 5c is sandwiched between a first magnetization fixed layer 5a and a second magnetization fixed layer 5b, the effects of the present invention can be achieved. In the TMR element 10 shown in FIG. 3, the first magnetization fixed layer 5a is in contact with the antiferromagnetic layer 4 and the first magnetization fixed layer 5a is given strong magnetic anisotropy of one direction by exchange interaction acting on these layers. As materials for use with the conductive layer 5c having the synthetic ferri-structure, there may be enumerated Ru, Cu, Cr, Au, Ag, etc. for example. Other layers of the TMR element 10 shown in FIG. 3 are substantially similar to those of the TMR element 1 shown in FIG. 1. Hence, these layers are denoted by the same reference numerals in FIG. 1 and therefore need not be described in detail.

Moreover, it is needless to say that the TMR element 1 of the present invention is not limited to the layer arrangements shown in FIGS. 1 and 3 and can take various conventional layer arrangements.

Further, the above-mentioned effects can be achieved even when the present invention is applied to a spin-valve type magnetoresistive effect element having a pair of ferromagnetic layers opposed to each other through a nonmagnetic conductive layer to cause a current to flow in the direction perpendicular to the film plane to obtain a magnetoresistive change.

The magnetoresistive effect element such as the above-mentioned TMR element is suitable for use with a magnetic memory device such as an MRAM. The MRAM using the TMR element according to the present invention will be described below with reference to FIGS. 4 and 5.

Figure 4:
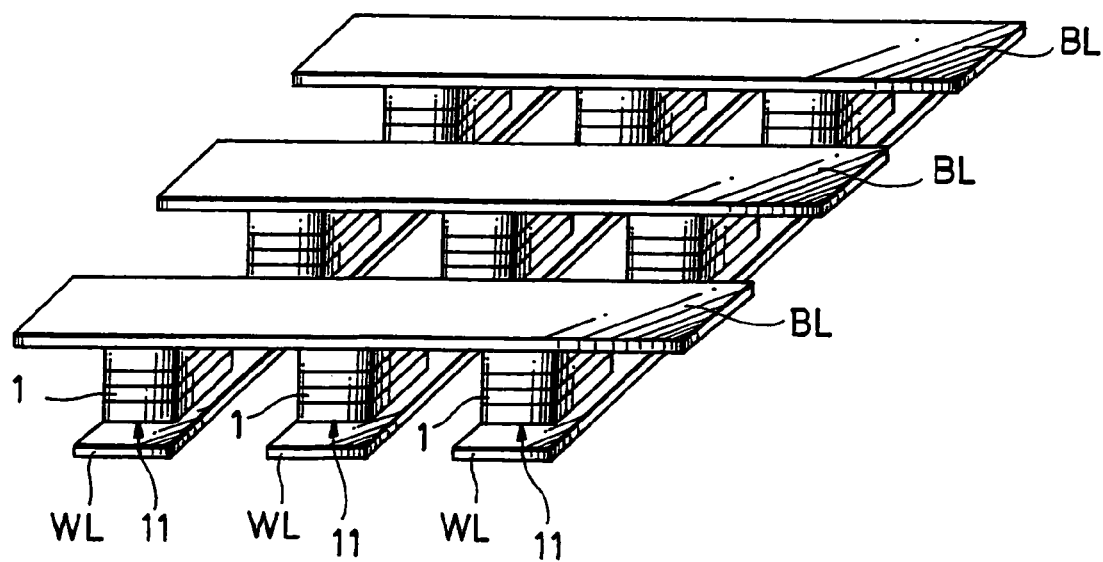
FIG. 4 is a schematic perspective view of a main portion of a cross-point type MRAM array that includes a TMR element according to the present invention as a memory cell.

FIG. 4 shows a cross-point type MRAM array including the TRM element according to the present invention. The MRAM array shown in this sheet of drawing includes a plurality of word lines WL and a plurality of bit lines BL that are intersecting these word lines WL and a memory cell 11 in which the TMR element of the present invention is disposed at the crossing point between the word line WL and the bit line BL. Specifically, this MRAM array has 3×3 memory cells 11 disposed in a matrix fashion. It is needless to say that the TMR element for use with the MRAM array is not limited to the TMR element shown in FIG. 1 and may be an element having any arrangement such as the TMR element 10 shown in FIG. 3 and which has a synthetic ferri-structure in which one of the ferromagnetic layers of the magnetoresistive effect element having the arrangement to cause a current to flow in the direction perpendicular to the layer surface to obtain a magnetoresistive change contains the above-mentioned ferromagnetic materials.

Figure 5:
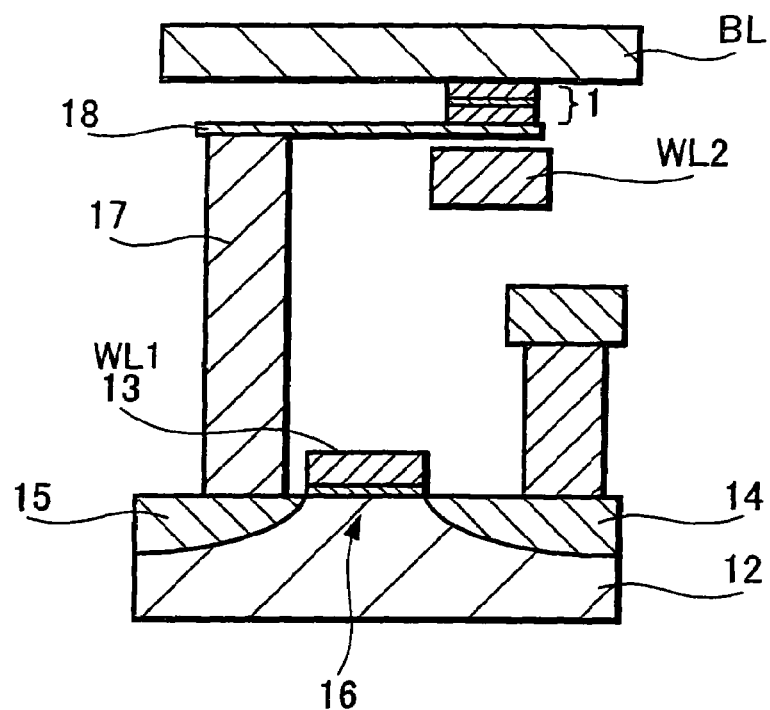
FIG. 5 is a cross-sectional view showing a memory cell shown in FIG. 4 in an enlarged-scale.

Each memory cell 11 includes a silicon substrate 12 on which a transistor 16 composed of a gate electrode 13, a source region 14 and a drain region 15 is provided as shown in FIG. 5, for example. The gate electrode 13 comprises a read word line WL1. A write word line WL2 is formed on the gate electrode 13 through an insulating layer. A contact metal 17 is interconnected to the drain region 15 of the transistor 16, and an underlayer 18 is further interconnected to the contact metal 17. This underlayer 18 has the TMR element 1 of the present invention at its position corresponding to the upper portion of the write word line WL2. The bit line BL that crosses the word lines WL1 and WL2 at a right angle is formed on this TMR element 1.

Since the MRAM to which the present invention is applied uses the TMR element 1 in which any one of the ferromagnetic layers comprising the ferromagnetic tunnel junction contains specific chemical elements, it is extremely excellent in TMR output and hence stability of memory operation can make great improvement. Since the MRAM of the present invention uses the TMR element 1 in which the bias voltage dependence characteristic of the TMR ratio is improved, the low resistance state and the high resistance state can be easily distinguished from each other when information is read out from this memory, and hence the error rate can decrease. Further, since the noise can decrease in the R-H curve and the asteroid characteristic can be improved, the write error can decrease. In conclusion, the MRAM of the present invention can satisfy the read characteristic and the write characteristic at the same time.

The magnetoresistive effect element such as the TMR element of the present invention is not limited to the aforementioned magnetic memory device and can also be applied to a magnetic head, a hard disk drive having this magnetic head mounted thereon, IC chips, various kinds of electronic devices such as personal computers, personal digital assistants and mobile phones and electric devices.

The present invention is not limited to the above descriptions and may properly be modified without departing from the gist of the present invention.

INVENTIVE EXAMPLES

Figure 6:
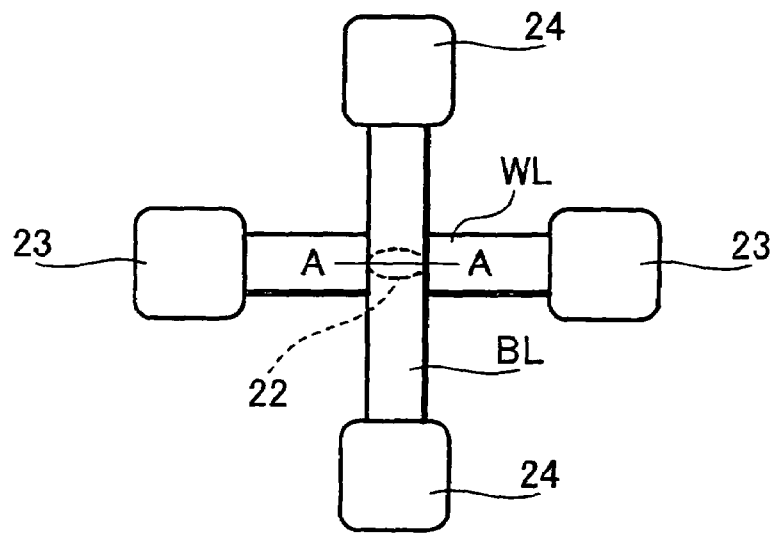
FIG. 6 is a plan view of a TEG that is used to test TMR elements.
Figure 7:
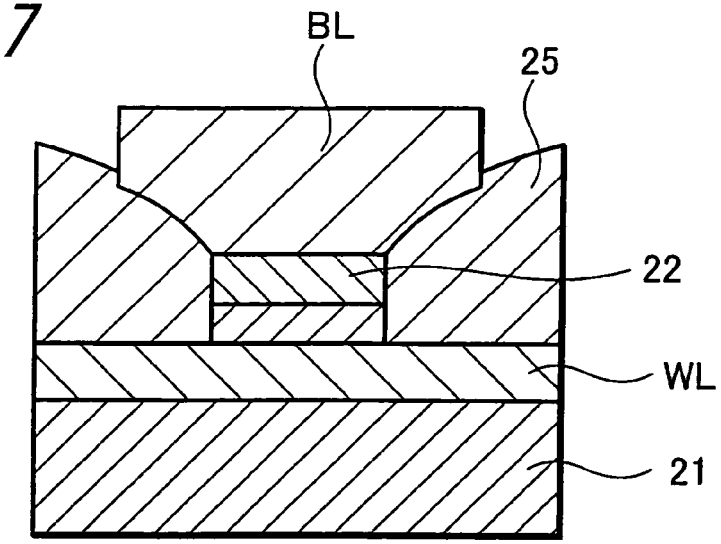
FIG. 7 is a cross-sectional view taken along the line A-A in FIG. 6.

Specific inventive examples to which the present invention is applied will be described below with reference to the results of experiments. Although switching transistors and the like are available as MRAM in addition to TMR element as has been set forth with reference to FIGS. 4 and 5, according to the inventive examples, in order to examine the TMR characteristics, a wafer in which only a ferromagnetic tunnel junction is formed as shown in FIGS. 6 and 7 had been examined.

Experiment 1

First, we have examined effects achieved by any one of ferromagnetic layer of a ferromagnetic tunnel junction when it contains Fe, Co and B and an optimum range of the composition of the ferromagnetic layer.

<Sample 1>

As shown in FIGS. 6 and 7, in a characteristic evaluation element used in the inventive examples (Test Element Group: TEG) a word line WL and a bit line BL are perpendicular to each other on a substrate 21 and a magnetoresistive effect element 22 is formed at the portion in which these word line WL and bit line BL are crossing each other. The magnetoresistive effect element 22 formed herein is elliptic in shape and has a minor axis of 0.5 μm×a major axis of 1.0 μm. The word line WL and the bit line BL have terminal pads 23, 24 formed at their respective ends, and the word line WL and the bit line BL are electrically insulated from each other by an insulating film made of $Al_2O_3$.

Such TEG will be manufactured as follows. First, a word line material is deposited on the substrate 21 and masked by a photolithography, where after other portion than the word line is selectively etched away with application of Ar plasma laser and thereby the word line is formed. At that time, the region other than the word line was etched away up to 5 nm of the depth of the substrate. A silicon substrate with a 0.6 mm-thick heat oxide film (2 μm) was used as the substrate.

Next, the ferromagnetic tunnel junction having the following layer arrangement (1), i.e., TMR element was produced on the word line WL by a well-known lithography method and etching. Numerical values within the parentheses indicate film thicknesses.

Ta(3 nm)/Cu(100 nm)/PtMn(20 nm)/CoFe(3 nm)/Ru (0.8 nm)/CoFe(2.5 nm)/Al(1 nm)–$O_x$/FeCoB(4 nm)/Ta(5 nm)

In the above-described layer arrangement, the composition of FeCoB comprising the information recording layer was selected to be $Fe_9Co_{81}B_{10}$ (atomic %). The composition of other layer made of CoFe than the information recording layer was selected to be $Co_{75}Fe_{25}$ (atomic %).

The Al—$O_x$ layer that serves as the tunnel barrier layer was formed in such a manner that a metal Al film having a thickness of 1 nm was deposited by a DC sputtering method, where after the metal Al film was oxidized with application of ICP plasma under the condition that the flow rate of oxygen/argon gas was selected to be 1:1, the chamber gas pressure being selected to be 0.1 mTorr. The oxidation time was selected to be 30 seconds in this inventive example although it may change depending upon the ICP plasma output.

Other films that the Al—$O_x$ layer serving as the tunnel barrier layer were deposited by a DC magnetron sputtering method.

After the above-described films have been laminated, the resultant product was annealed within a field anneal furnace for 4 hours at 270° C. with application of a magnetic field of 10 kOe and the PtMn layer that is the antiferromagnetic layer was annealed for normalization, thereby resulting in the ferromagnetic tunnel junction being obtained.

After the above-described ferromagnetic tunnel junction has been manufactured, an insulating layer 25 having a thickness of about 100 nm was deposited by sputtering the $Al_2O_3$ film. Further, the bit lines BL and the terminal pads 24 were formed by the photolithography and thereby the TEG shown in FIGS. 6 and 7 was obtained.

<Sample 2>

A TEG was obtained by a similar manner to that of the sample 1 except that the composition of the information recording layer was selected to be $Fe_8Co_{72}B_{20}$ (atomic %) in the layer arrangement (1) of the ferromagnetic tunnel junction.

<Sample 3>

A TEG was obtained by a similar manner to that of the sample 1 except that the composition of the information recording layer was selected to be $Fe_7Co_{63}B_{30}$ (atomic %) in the layer arrangement (1) of the ferromagnetic tunnel junction.

<Sample 4>

A TEG was obtained by a similar manner to that of the sample 1 except that the composition of the information recording layer was selected to be $Fe_{22.5}Co_{67.5}B_{10}$ (atomic %) in the layer arrangement (1) of the ferromagnetic tunnel junction.

<Sample 5>

A TEG was obtained by a similar manner to that of the sample 1 except that the composition of the information recording layer was selected to be $Fe_{20}Co_{60}B_{20}$ (atomic %) in the layer arrangement (1) of the ferromagnetic tunnel junction.

<Sample 6>

A TEG was obtained by a similar manner to that of the sample 1 except that the composition of the information recording layer was selected to be $Fe_{17.5}Co_{52.5}B_{30}$ (atomic %) in the layer arrangement (1) of the ferromagnetic tunnel junction.

<Sample 7>

A TEG was obtained by a similar manner to that of the sample 1 except that the composition of the information recording layer was selected to be $Fe_{36}Co_{54}B_{10}$ (atomic %) in the layer arrangement (1) of the ferromagnetic tunnel junction.

<Sample 8>

A TEG was obtained by a similar manner to that of the sample 1 except that the composition of the information recording layer was selected to be $Fe_{32}Co_{48}B_{20}$ (atomic %) in the layer arrangement (1) of the ferromagnetic tunnel junction.

<Sample 9>

A TEG was obtained by a similar manner to that of the sample 1 except that the composition of the information recording layer was selected to be $Fe_{28}Co_{42}B_{30}$ (atomic %) in the layer arrangement (1) of the ferromagnetic tunnel junction.

<Sample 10>

A TEG was obtained by a similar manner to that of the sample 1 except that the composition of the information recording layer was selected to be $Fe_{25}Co_{75}$ (atomic %) in the layer arrangement (1) of the ferromagnetic tunnel junction.

<Sample 11>

A TEG was obtained by a similar manner to that of the sample 1 except that the composition of the information recording layer was selected to be $Fe_{10}Co_{82}B_{8}$ (atomic %) in the layer arrangement (1) of the ferromagnetic tunnel junction.

<Sample 12>

A TEG was obtained by a similar manner to that of the sample 1 except that the composition of the information recording layer was selected to be $Fe_{50}Co_{43}B_{7}$ (atomic %) in the layer arrangement (1) of the ferromagnetic tunnel junction.

<Sample 13>

A TEG was obtained by a similar manner to that of the sample 1 except that the composition of the information recording layer was selected to be $Co_{95}B_{5}$ (atomic %) in the layer arrangement (1) of the ferromagnetic tunnel junction.

<Sample 14>

A TEG was obtained by a similar manner to that of the sample 1 except that the composition of the information recording layer was selected to be $Fe_{10}Co_{55}B_{35}$ (atomic %) in the layer arrangement (1) of the ferromagnetic tunnel junction.

<Sample 15>

A TEG was obtained by a similar manner to that of the sample 1 except that the composition of the information recording layer was selected to be $Fe_{30}Co_{35}B_{35}$ (atomic %) in the layer arrangement (1) of the ferromagnetic tunnel junction.

<Sample 16>

A TEG was obtained by a similar manner to that of the sample 1 except that the composition of the information recording layer was selected to be $Fe_{40}Co_{30}B_{30}$ (atomic %) in the layer arrangement (1) of the ferromagnetic tunnel junction.

<Sample 17>

A TEG was obtained by a similar manner to that of the sample 1 except that the composition of the information recording layer was selected to be $Fe_{50}Co_{30}B_{20}$ (atomic %) in the layer arrangement (1) of the ferromagnetic tunnel junction.

With respect to the TEGs of the thus manufactured samples 1 to 17, the TMR ratios, the dispersions of the coercive force Hc, the rectangle ratios and the bias voltage dependences were measured as follows.

Measurement of TMR Ratio:

Although the magnetic memory device such as an ordinary MRAM is able to write information by inverting the magnetization direction of the magnetoresistive effect element with application of a current magnetic field, in this inventive example, the TMR ratios were measured by inverting the magnetization direction of the magnetoresistive effect element with application of an external magnetic field. Specifically, an external magnetic field for use in inverting the magnetization direction of the information recording layer of the information recording layer was applied in the direction parallel to the easy axis of magnetization of the information recording layer. The magnitude of the external magnetic field for use in measurement was selected to be 500 Oe. Next, at the same time the magnetoresistive effect element was swept from −500 Oe to +500 Oe as seen from one easy axis of magnetization of the information recording layer, a tunnel current was caused to flow through the ferromagnetic tunnel junction by adjusting a bias voltage such that the bias voltage applied to the terminal pad 23 of the word line WL and the terminal pad 24 of the bit line BL may reach 100 mV. Resistance values relative to respective external magnetic fields obtained at that time were measured. Then, a resistance between a resistance value obtained in the condition that the magnetizations of the magnetization fixed layer and the information recording layer are in the anti-parallel state and that the resistance is high and a resistance value obtained in the condition that the magnetizations of the magnetization fixed layer and the information recording layer are in the equilibrium state and that the resistance is low was selected to be the TMR ratio. This TMR ratio should preferably be higher than 45% from a standpoint of obtaining satisfactory read characteristics.

Measurement of Dispersions of Coercive Force Hc:

The coercive force (Hc) was calculated from R-H curves obtained from the measurement method of the above-described TMR ratio. Then, the R-H curves were repeatedly measured 50 times with respect to the same element, and the coercive force (Hc) was measured with respect to a half value between the maximum resistance value and the minimum resistance value. The fluctuation value was calculated as a µHc/Hc mean value. From the standpoint of improving the write characteristic, the dispersions of the coercive force (Hc) should be less than 4%.

Measurement of Rectangle Ratio:

A rectangle ratio of wave form was calculated from the R-H curve. Specifically, the rectangle ratio indicates a value of a ratio between R1max-R1min of the R-H curve in a range of the magnetic field from −500 Oe to +500 Oe and R2max-R2 min at the zero magnetic field (H=0) upon measurement, i.e., (R2max-R2min)/R1max-R1min). From the standpoint of improving the write characteristic, the rectangle ratio should preferably be greater than 0.9.

Measurement of Bias Voltage Dependence:

The TMR ratios were calculated by measuring the R-H curves while the bias voltage was being changed at the unit of 10 mV from 100 mV to 1000 mV and were plotted relative to the bias voltage. Then, a half bias voltage relative to the TMR ratio obtained at the extrapolated bias voltage of 0 mV and the thus obtained bias voltage was set to be Vhalf. The bias voltage Vhalf should preferably be greater than 550 mV.

Compositions and film thicknesses of the information recording layers of the above-mentioned samples 1 to 17 are shown on the following table 1. The measured results of thus obtained TMR ratios, the dispersions of the coercive force Hc, the rectangle ratios and the bias voltage dependences are shown on the following table 2.

TABLE 1

| Sample No. | Film arrangement | The Fe content (atomic %) | The Co content (atomic %) | The Ni content (atomic %) | The B content (atomic %) | Film thickness of info. rec. layer (nm) |
|---|---|---|---|---|---|---|
| 1 | 1 | 9 | 81 | — | 10 | 4 |
| 2 | 1 | 8 | 72 | — | 20 | 4 |
| 3 | 1 | 7 | 63 | — | 30 | 4 |
| 4 | 1 | 22.5 | 67.5 | — | 10 | 4 |
| 5 | 1 | 20 | 60 | — | 20 | 4 |
| 6 | 1 | 17.5 | 52.5 | — | 30 | 4 |
| 7 | 1 | 36 | 54 | — | 10 | 4 |
| 8 | 1 | 32 | 48 | — | 20 | 4 |
| 9 | 1 | 28 | 42 | — | 30 | 4 |
| 10 | 1 | 25 | 75 | — | — | 4 |
| 11 | 1 | 10 | 82 | — | 8 | 4 |
| 12 | 1 | 50 | 43 | — | 7 | 4 |
| 13 | 1 | — | 95 | — | 5 | 4 |
| 14 | 1 | 10 | 55 | — | 35 | 4 |
| 15 | 1 | 30 | 35 | — | 35 | 4 |
| 16 | 1 | 40 | 30 | — | 30 | 4 |
| 17 | 1 | 50 | 30 | — | 20 | 4 |

TABLE 2

| Sample No. | Film arrangement | TMR ratio (%) | Dispersions of Hc value obtained when measure repeatedly (%) | Rectangle ratio | Vhalf (mV) |
|---|---|---|---|---|---|
| 1 | 1 | 46 | 3.8 | 0.9 | 550 |
| 2 | 1 | 55 | 1.9 | 0.92 | 700 |
| 3 | 1 | 50 | 2.4 | 0.94 | 620 |
| 4 | 1 | 50 | 3.6 | 0.94 | 560 |
| 5 | 1 | 58 | 1.6 | 0.96 | 730 |
| 6 | 1 | 52 | 2.2 | 0.96 | 640 |
| 7 | 1 | 49 | 3.8 | 0.92 | 560 |
| 8 | 1 | 56 | 1.8 | 0.93 | 720 |
| 9 | 1 | 52 | 2.5 | 0.94 | 610 |
| 10 | 1 | 42 | 5.2 | 0.72 | 540 |
| 11 | 1 | 37 | 4.4 | 0.83 | 570 |
| 12 | 1 | 44 | 5.7 | 0.86 | 580 |
| 13 | 1 | 44 | 6.6 | 0.72 | 590 |
| 14 | 1 | 28 | 7.9 | 0.76 | 490 |
| 15 | 1 | 23 | 6.4 | 0.74 | 510 |
| 16 | 1 | 19 | 5.5 | 0.82 | 530 |
| 17 | 1 | 16 | 4.9 | 0.79 | 540 |

As is clear from the above-mentioned tables 1 and 2, while the samples 11 to 13 in which the information recording layer contains a very small amount of B demonstrate satisfactory values with respect to only the bias voltage dependences, the sample 10 in which any of the magnetization fixed layer and the information recording layer does not contain B is inferior in all of the TMR ratio, the dispersion of the coercive force (Hc), the rectangle ratio and the bias voltage dependence Vhalf. From these points, it is to be understood that the write characteristic can be improved when at least one of the ferromagnetic layers of the ferromagnetic tunnel junction contains Fe, Co and B.

The samples 1 to 9 of which the alloy compositions fall within the alloy composition of the present invention demonstrated excellent TMR characteristics in which TMR ratios of greater than 45% were obtained, the rectangle ratios of greater than 0.9 being obtained. In the samples 1 to 9, the dispersions of the coercive force (Hc) were suppressed to be less than 4%, and hence they are placed in the very stable state magnetically. Further, in the samples 1 to 9, the bias voltage dependences Vhalf demonstrate values higher than 550 mV, and hence a difference voltage of 0/1 increases when the magnetoresistive effect element operates as the MRAM. Accordingly, the samples 1 to 9 are excellent both in the write characteristic and the read characteristic, and hence can realize the MRAM that has very small error when information is written therein and read out therefrom. On the other hand, it is clear that the samples 10 to 17 which are outside of the composition of the present invention are inferior in TMR ratio, dispersion of coercive force (Hc), rectangle ratio and bias voltage dependence Vhalf and that they have unsatisfactory write characteristic and read characteristic.

Figure 8:
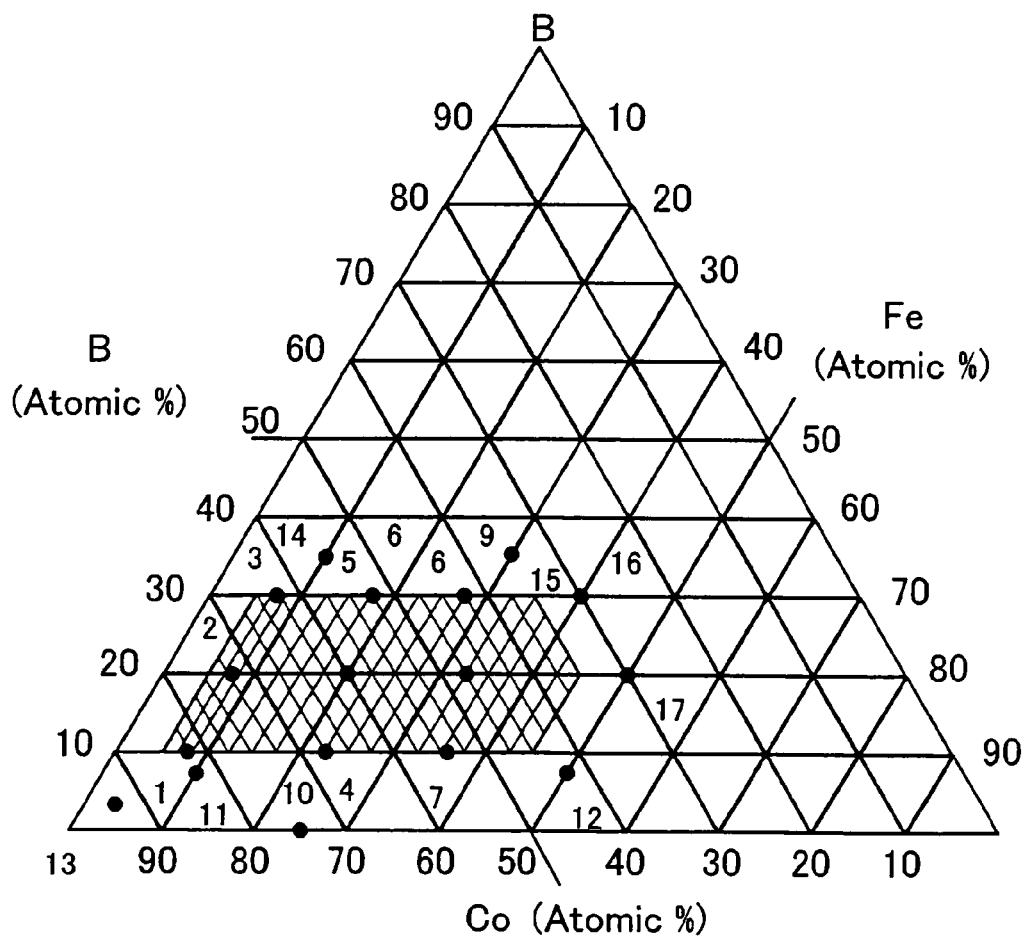
FIG. 8 is a ternary based phase diagram to which reference will be made in explaining an optimum alloy composition of the present invention.

FIG. 8 is a ternary based phase diagram of Fe, Co, B and shows their plotted results. Numerical values on this sheet of drawing express sample numbers. An are a shown hatched in FIG. 8 indicates the composition range of the present invention, i.e., the composition range in which Fe lies within a range of from 5 atomic % to 45 atomic %, Co lies within a range of from 35 atomic % to 85 atomic % and B lies within a range of from 10 atomic % to 30 atomic %. The samples 1 to 9 have the compositions that may fall within these ranges.

From the above-mentioned points, it is to be understood that any one of the ferromagnetic layers of the ferromagnetic tunnel junction should preferably contain Fe, Co and B, Fe should preferably fall within a range of from 5 atomic % to 45 atomic %, Co should preferably fall within a range of from 35 atomic % to 85 atomic % and that B should preferably fall within a range of from 10 atomic % to 30 atomic %.

Experiment 2

Next, an optimum film thickness range of the information recording layer has been examined while the layer arrangement of the ferromagnetic tunnel junction was being changed.

<Sample 18>

A TEG was obtained by a similar method to that of the sample 1 except that the layer arrangement of the ferromagnetic tunnel junction was selected to be the following layer arrangement (2) and that the compositions of the magnetization fixed layer and the information recording layer were changed. Specifically, in this sample 18, the composition of the magnetization fixed layer was selected to be $Fe_{20}Co_{60}B_{20}$ (atomic %) that may fall within the composition range of the present invention. Moreover, the composition of the information recording layer in this sample 19 was selected to be $Fe_{45}Co_{45}B_{20}$ (atomic %). Further, in this sample 18, the film thickness of the information recording layer was selected to be 5 nm unlike the samples 1 to 17. Ta (3 nm)/Cu (100 nm)/PtMn(20 nm)/CoFe(3 nm)/Ru(0.8 nm)/CoFe(2 nm)/CoFeB(1 nm)/Al(1 nm)–$O_x$/FeCoB(5 nm)/Ta(5 nm)

<Sample 19>

A TEG was obtained by a similar manner to that of the sample 18 except that the composition of the information recording layer was selected to be $Fe_{40}Co_{40}B_{20}$ (atomic %) in the layer arrangement (2) of the ferromagnetic tunnel junction.

<Sample 20>

A TEG was obtained by a similar manner to that of the sample 18 except that the composition of the information recording layer was selected to be $Fe_{35}Co_{35}B_{30}$ (atomic %) in the layer arrangement (2) of the ferromagnetic tunnel junction.

<Sample 21>

A TEG was obtained by a similar manner to that of the sample 18 except that the composition of the information recording layer was selected to be $Fe_8Co_{72}B_{20}$ (atomic %) in the layer arrangement (2) of the ferromagnetic tunnel junction.

<Sample 22>

A TEG was obtained by a similar manner to that of the sample 18 except that the composition of the information recording layer was selected to be $Fe_{20}Co_{60}B_{20}$ (atomic %) in the layer arrangement (2) of the ferromagnetic tunnel junction.

<Sample 23>

A TEG was obtained by a similar manner to that of the sample 18 except that the composition of the information recording layer was selected to be $Fe_{32}Co_{48}B_{20}$ (atomic %) in the layer arrangement (2) of the ferromagnetic tunnel junction.

<Sample 24>

A TEG was obtained by a similar manner to that of the sample 18 except that the composition of the information recording layer was selected to be $Fe_{40}Co_{40}B_{20}$ (atomic %) in the layer arrangement (2) of the ferromagnetic tunnel junction.

<Sample 25>

A TEG was obtained by a similar manner to that of the sample 18 except that the composition of the information recording layer was selected to be $Fe_8Co_{72}B_{20}$ (atomic %) in the layer arrangement (2) of the ferromagnetic tunnel junction and that the film thickness of the information recording layer was selected to be 1.8 nm.

<Sample 26>

A TEG was obtained by a similar manner to that of the sample 18 except that the composition of the information recording layer was selected to be $Fe_{20}Co_{60}B_{20}$ (atomic %) in the layer arrangement (2) of the ferromagnetic tunnel junction.

<Sample 27>

A TEG was obtained by a similar manner to that of the sample 18 except that the composition of the information recording layer was selected to be $Fe_{32}Co_{60}B_{20}$ (atomic %) in the layer arrangement (2) of the ferromagnetic tunnel junction.

<Sample 28>

A TEG was obtained by a similar manner to that of the sample 18 except that the composition of the information recording layer was selected to be $Fe_9Co_{81}B_{10}$ (atomic %) in the layer arrangement (2) of the ferromagnetic tunnel junction and that the film thickness of the information recording layer was selected to be 10.5 nm.

<Sample 29>

A TEG was obtained by a similar manner to that of the sample 18 except that the composition of the information recording layer was selected to be $Fe_8Co_{72}B_{20}$ (atomic %) in the layer arrangement (2) of the ferromagnetic tunnel junction.

<Sample 30>

A TEG was obtained by a similar manner to that of the sample 18 except that the composition of the information recording layer was selected to be $Fe_7Co_{63}B_{30}$ (atomic %) in the layer arrangement (2) of the ferromagnetic tunnel junction.

Compositions and film thicknesses of the information recording layers of the samples 18 to 30 are shown on the following table 3. Moreover, the measured results of the thus calculated TMR ratios, the dispersions of the coercive force Hc, the rectangle ratios and the bias voltage dependences are shown on the following table 4.

TABLE 3

| Sample No. | Film arrangement | The Fe content (atomic %) | The Co content (atomic %) | The Ni content (atomic %) | The B content (atomic %) | Film thickness of info. rec. layer (nm) |
|---|---|---|---|---|---|---|
| 18 | 2 | 45 | 45 | — | 10 | 5 |
| 19 | 2 | 40 | 40 | — | 20 | 5 |
| 20 | 2 | 35 | 35 | — | 30 | 5 |
| 21 | 2 | 8 | 72 | — | 20 | 2.5 |

TABLE 3-continued

| Sample No. | Film arrangement | The Fe content (atomic %) | The Co content (atomic %) | The Ni content (atomic %) | The B content (atomic %) | Film thickness of info. rec. layer (nm) |
|---|---|---|---|---|---|---|
| 22 | 2 | 20 | 60 | — | 20 | 2.5 |
| 23 | 2 | 32 | 48 | — | 20 | 2.5 |
| 24 | 2 | 40 | 40 | — | 20 | 2.5 |
| 25 | 2 | 8 | 72 | — | 20 | 1.8 |
| 26 | 2 | 20 | 60 | — | 20 | 1.8 |
| 27 | 2 | 32 | 48 | — | 20 | 1.8 |
| 28 | 2 | 9 | 81 | — | 10 | 10.5 |
| 29 | 2 | 8 | 72 | — | 20 | 10.5 |
| 30 | 2 | 7 | 63 | — | 30 | 10.5 |

TABLE 4

| Sample No. | Film arrangement | TMR ratio (%) | Dispersions of Hc value obtained when measure repeatedly (%) | Rectangle ratio | Vhalf (mV) |
|---|---|---|---|---|---|
| 18 | 2 | 47 | 3.9 | 0.91 | 560 |
| 19 | 2 | 54 | 2 | 0.93 | 710 |
| 20 | 2 | 50 | 2.5 | 0.93 | 610 |
| 21 | 2 | 51 | 1.7 | 0.93 | 680 |
| 22 | 2 | 53 | 1.4 | 0.97 | 710 |
| 23 | 2 | 51 | 1.6 | 0.94 | 700 |
| 24 | 2 | 50 | 1.8 | 0.94 | 690 |
| 25 | 2 | 33 | 1.7 | 0.94 | 510 |
| 26 | 2 | 31 | 2 | 0.91 | 470 |
| 27 | 2 | 30 | 2.2 | 0.9 | 460 |
| 28 | 2 | 44 | 5.6 | 0.75 | 530 |
| 29 | 2 | 47 | 5.2 | 0.84 | 600 |
| 30 | 2 | 45 | 5 | 0.81 | 600 |

As is clear from the above-mentioned tables 3 and 4, the samples 25 to 27 in which the film thickness of the information recording layer was 1.8 nm and the samples 28 to 30 in which the film thickness of the information recording layer was 10.5 nm were slightly inferior to the samples 18 to 24 in any one of the respective characteristics. Accordingly, the film thickness of the information recording layer has the optimum range of the film thickness and it is to be understood that the film thickness should preferably fall within a range of from 1 nm to 10 nm, in particular, within a range of from 2.5 nm to 7 nm.

Experiment 3

Next, magnetoresistive effect elements in which any one of the ferromagnetic layers comprising the ferromagnetic tunnel junction further contains Ni in addition to Fe, Co, B will be examined.

<Sample 31>

A TEG was obtained by a similar manner to that of the sample 1 except that the composition of the information recording layer was selected to be $Fe_{20}Co_{35}Ni_{35}B_{10}$ (atomic %) in the layer arrangement (1) of the ferromagnetic tunnel junction.

<Sample 32>

A TEG was obtained by a similar manner to that of the sample 1 except that the composition of the information recording layer was selected to be $Fe_{10}Co_{35}Ni_{35}B_{20}$ (atomic %) in the layer arrangement (1) of the ferromagnetic tunnel junction.

<Sample 33>

A TEG was obtained by a similar manner to that of the sample 1 except that the composition of the information recording layer was selected to be $Fe_7Co_{35}Ni_{28}B_{30}$ (atomic %) in the layer arrangement (1) of the ferromagnetic tunnel junction.

<Sample 34>

A TEG was obtained by a similar manner to that of the sample 1 except that the composition of the information recording layer was selected to be $Fe_{15}Co_{50}Ni_{25}B_{10}$ (atomic %) in the layer arrangement (1) of the ferromagnetic tunnel junction.

<Sample 35>

A TEG was obtained by a similar manner to that of the sample 1 except that the composition of the information recording layer was selected to be $Fe_{15}Co_{40}Ni_{25}B_{20}$ (atomic %) in the layer arrangement (1) of the ferromagnetic tunnel junction.

<Sample 36>

A TEG was obtained by a similar manner to that of the sample 1 except that the composition of the information recording layer was selected to be $Fe_{10}Co_{35}Ni_{25}B_{30}$ (atomic %) in the layer arrangement (1) of the ferromagnetic tunnel junction.

<Sample 37>

A TEG was obtained by a similar manner to that of the sample 1 except that the composition of the information recording layer was selected to be $Fe_{10}Co_{35}Ni_{35}B_{20}$ (atomic %) in the layer arrangement (1) of the ferromagnetic tunnel junction and that the film thickness of the information recording layer was selected to be 2.5 nm.

<Sample 38>

A TEG was obtained by a similar manner to that of the sample 1 except that the composition of the information recording layer was selected to be $Fe_{15}Co_{40}Ni_{25}B_{20}$ (atomic %) in the layer arrangement (1) of the ferromagnetic tunnel junction and that the film thickness of the information recording layer was selected to be 2.5 nm.

<Sample 39>

A TEG was obtained by a similar manner to that of the sample 1 except that the composition of the information recording layer was selected to be $Fe_{20}Co_{30}Ni_{30}B_{20}$ (atomic %) in the layer arrangement (1) of the ferromagnetic tunnel junction.

<Sample 40>

A TEG was obtained by a similar manner to that of the sample 1 except that the composition of the information recording layer was selected to be $Fe_5Co_{40}Ni_{45}B_{10}$ (atomic %) in the layer arrangement (1) of the ferromagnetic tunnel junction.

Compositions and film thicknesses of the information recording layers of the samples 31 to 40 are shown on the following table 5. Moreover, the measured results of the thus calculated TMR ratios, the dispersions of the coercive force Hc, the rectangle ratios and the bias voltage dependences are shown on the following table 6.

TABLE 5

| Sample No. | Film arrangement | The Fe content (atomic %) | The Co content (atomic %) | The Ni content (atomic %) | The B content (atomic %) | Film thickness of info. rec. layer (nm) |
|---|---|---|---|---|---|---|
| 31 | 1 | 20 | 35 | 35 | 10 | 4 |
| 32 | 1 | 10 | 35 | 35 | 20 | 4 |
| 33 | 1 | 7 | 35 | 28 | 30 | 4 |
| 34 | 1 | 15 | 50 | 25 | 10 | 4 |
| 35 | 1 | 15 | 40 | 25 | 20 | 4 |
| 36 | 1 | 10 | 35 | 25 | 30 | 4 |
| 37 | 1 | 10 | 35 | 35 | 20 | 2.5 |
| 38 | 1 | 15 | 40 | 25 | 20 | 2.5 |
| 39 | 1 | 20 | 30 | 30 | 20 | 4 |
| 40 | 1 | 5 | 40 | 45 | 10 | 4 |

TABLE 6

| Sample No. | Film arrangement | TMR ratio (%) | Dispersions of Hc value obtained when measure repeatedly (%) | Rectangle ratio | Vhalf (mV) |
|---|---|---|---|---|---|
| 31 | 1 | 45 | 3.2 | 0.94 | 550 |
| 32 | 1 | 52 | 1.4 | 0.97 | 660 |
| 33 | 1 | 48 | 1.9 | 0.95 | 600 |
| 34 | 1 | 44 | 3.4 | 0.93 | 550 |
| 35 | 1 | 50 | 1.7 | 0.95 | 690 |
| 36 | 1 | 46 | 2.1 | 0.95 | 600 |
| 37 | 1 | 43 | 2 | 0.96 | 580 |
| 38 | 1 | 46 | 1.6 | 0.96 | 670 |
| 39 | 1 | 40 | 2.1 | 0.94 | 560 |
| 40 | 1 | 36 | 3.4 | 0.88 | 520 |

As is clear from the above-mentioned tables 5 and 6, it is to be understood that the samples 31 to 38 in which the composition ranges of Fe, Co, B fall within the proper ranges could obtain excellent write characteristics and excellent read characteristics even when they further contain Ni. However, the sample 40 in which the Ni content was 45 atomic % caused the TMR ratio to be lowered, caused the rectangle ratio to be deteriorated and caused the bias voltage dependence Vhalf to be lowered. From these points, it is to be understood that the optimum range exists in the Ni content and that this content should preferably be less than 35 atomic %. Moreover, since the TMR ratio was lowered in the sample 39 in which the Co content is insufficient, it is to be understood that the Fe and Co contents are important as the alloy which serves as the base of the ferromagnetic layer.

As set forth above, according to the present invention, by improving the MR ratio, the rectangle property of the R-H curve, the bias voltage dependence of the MR ratio and the dispersion of the coercive force, it is possible to provide a magnetoresistive effect element that can satisfy the write characteristic and the read characteristic at the same time when it is applied for use with a magnetic memory device and the like.

Furthermore, by using such magnetoresistive effect element, it is possible to realize a magnetic memory device that can satisfy the write characteristic and the read characteristic at the same time.

The invention claimed is:

1. A magnetic memory device comprising:
a magnetoresistive effect element having a pair of ferromagnetic layers opposed to each other through an intermediate layer to cause a current to flow in the direction perpendicular to the layer plane to obtain a magnetoresistive change; and
word lines and bit lines having said magnetoresistive effect element sandwiched in the thickness direction,
wherein,
at least one of said ferromagnetic layers contains a ferromagnetic material containing Fe, Co and B, and
said ferromagnetic material contains $Fe_aCo_bNi_cB_d$, where a, b, c and d represent atomic % and $5 \leq a \leq 45$, $35 \leq b \leq 85$, $0 \leq c \leq 35$, $10 \leq d \leq 30$ and $a+b+c+d=100$.

2. A magnetic memory device according to claim 1, wherein said ferromagnetic material contains $Fe_xCo_yB_z$, where x, y and z represent atomic % and $5 \leq x \leq 45$, $35 \leq y \leq 85$, $10 \leq z \leq 30$ and $x+y+z=100$.

3. A magnetic memory device according to claim 1, wherein said ferromagnetic material is amorphous.

4. A magnetic memory device according to claim 1, wherein said magnetoresistive effect element is a tunnel magnetoresistive effect element using a tunnel barrier layer as said intermediate layer.

5. A magnetic memory device according to claim 1, wherein said magnetoresistive effect element is a spin-valve type magnetoresistive effect element in which one of said ferromagnetic layers is a magnetization fixed layer, the other one being an information recording layer.

6. A magnetic memory device according to claim 1, further including a synthetic ferri-structure.

* * * * *